(12) United States Patent
Kost

(10) Patent No.: US 7,791,427 B2
(45) Date of Patent: Sep. 7, 2010

(54) SYSTEMS AND METHODS TO MINIMIZE STARTUP TRANSIENTS IN CLASS D AMPLIFIERS

(75) Inventor: Michael A. Kost, Cedar Park, TX (US)

(73) Assignee: D2Audio Corporation, Milpitas, CA (US)

( * ) Notice: Subject to any disclaimer, the term of this patent is extended or adjusted under 35 U.S.C. 154(b) by 404 days.

(21) Appl. No.: 11/847,449

(22) Filed: Aug. 30, 2007

(65) Prior Publication Data

US 2009/0058549 A1 Mar. 5, 2009

(51) Int. Cl.
*H03K 7/08* (2006.01)
(52) U.S. Cl. .......................... 332/109; 330/10
(58) Field of Classification Search ......... 332/109–111; 330/10
See application file for complete search history.

(56) References Cited

U.S. PATENT DOCUMENTS 6,016,075 A * 1/2000 Hamo .................... 330/10
6,294,954 B1 * 9/2001 Melanson ................ 330/10

OTHER PUBLICATIONS

"Precision Switchmode Pulse Width Modulation Control Circuit," TL594, Semiconductor Components Industries, LLC, Nov. 2005 (12 pages).
"Dual-Channel Pulse-Width-Modulation (PWM) Control Circuit," TL1454A, TL1454AY, Texas Instruments, Incorporated, 2002 (26 pages).

* cited by examiner

*Primary Examiner*—David Mis
(74) *Attorney, Agent, or Firm*—Fliesler Meyer LLP

(57) ABSTRACT

Systems and methods for minimizing startup transients in digital audio controllers that may result in audible artifacts in the output of an audio amplification system. One embodiment comprises a digital PWM amplifier that includes a mechanism for controlling the amount of dead time in the audio output signal. When the amplifier starts up, the PWM signals provided to the output stage are simultaneously deasserted (i.e., there is dead time) for most of each switch period. The amount of dead time is gradually reduced over a series of switch periods until a nominal operating amount of dead time in each switch period is reached. Thus, the PWM signals are slowly ramped up from having a very large percentage of dead time (e.g., nearly 100%) to having a very small percentage of dead time (e.g., 1-2% to prevent shoot-through.)

20 Claims, 4 Drawing Sheets

SYSTEMS AND METHODS TO MINIMIZE STARTUP TRANSIENTS IN CLASS D AMPLIFIERS

BACKGROUND

1. Field of the Invention

The invention relates generally to audio amplifiers, and more particularly to systems and methods for minimizing startup transients in digital audio controllers that may result in audible artifacts in the output of an audio amplification system.

2. Related Art

Audio amplifiers are designed to receive input signals that typically have very low voltages and/or currents, and to generate corresponding output signals that generally have much higher voltages and/or currents. The input audio signal may undergo various types of signal conditioning and other processing which is generally intended to maintain the fidelity of the output signal with respect to the input signal. There may, however, be conditions in the operation of the amplifiers that cause unwanted artifacts in the output signal For example, in a Class-D pulse-width modulation (PWM) amplifier, transient currents that are generated in the output stage of the amplifier at startup may produce an audible "pop." This may result from any of several different causes, such as asymmetric power supply voltages on split rail half-bridge output stages, the charging of LC low-pass filter capacitors, or the charging of DC blocking capacitors.

In prior art systems, a typical solution to the problem of startup transients in high power outputs would be to add a relay in series with the speaker output. This relay would disconnect the speaker at startup so that the amplifier's output signal would not be applied to the speaker. As a result, none of the startup transients reach the speaker, and no associated pop is heard. After the system has settled and no significant startup transients remain, the relay is closed and the speaker is connected to the amplifier output. In prior art systems which have line-level outputs, clamp transistors are sometimes used to hold the output to a specific, benign voltage while the system initializes. After initialization, the clamp transistor is released, and the output is driven by the amplified audio signal.

While these prior art solutions to the problem of startup transients may be effective, they are not ideal. One reason for this is that components such as relays and clamp transistors which are used in the systems described above add both complexity and cost to the system. It would therefore be desirable to provide systems and methods that minimize the effects of startup transients while also avoiding the cost and complexity of adding extra components into the system.

SUMMARY OF THE INVENTION

One embodiment comprises a system for minimizing startup transients in digital audio controllers that may result in audible artifacts in the output of an audio amplification system. The system is implemented in a digital PWM amplifier that includes a mechanism for controlling the amount of dead time in the audio output signal. When the amplifier starts up, the PWM signals provided to the output stage are simultaneously deasserted (i.e., there is dead time) for most of each switch period. The amount of dead time is gradually reduced over a series of switch periods (occurring over a startup interval of 1-2 seconds) until a nominal operating amount of dead time in each switch period is reached. Thus, the PWM signals are slowly ramped up from having a very large percentage of dead time (e.g., nearly 100%) to having a very small percentage of dead time (e.g., 1-2%.)

One embodiment comprises a method for reducing audible artifacts of startup transients in PWM audio systems. The method includes receiving an input audio signal, generating a PWM output signal based on the input audio signal, and controlling the percentage of dead time in the PWM output signal to reduce the dead time from an initial percentage (e.g., at least 99%) at the beginning of a startup interval to a lower percentage (e.g., 1%-2%) at the end of the startup interval. The percentage of dead time in the PWM output signal may be gradually reduced over the startup interval, such as by decrementing the percentage of dead time in successive PWM switch periods. The startup interval may, for example, be 1-2 seconds.

In one embodiment, the percentage of dead time in the PWM output signal is controlled by generating rise and fall times for the PWM output signal, adding offsets to the rise times, and subtracting offsets from the fall times. The offsets cause the dead time in the signal, and are reduced over the startup interval to ramp down the dead time. The dead time in the signal may alternatively be produced by generating a normal PWM signal and then selectively enabling this signal to produce the PWM output signal. The PWM output signal may be provided to an output stage which generates an analog audio output signal based on the PWM output signal. The PWM output signal can alternatively be provided as a line-level output signal.

Another embodiment comprises an audio system which is configured to reduce audible artifacts of startup transients in PWM audio systems. The system is embodied in a PWM controller. The PWM controller is configured to receive an input audio signal, generate a PWM output signal based on the input audio signal, and control the percentage of dead time in the PWM output signal to reduce the dead time from an initial percentage at the beginning of the startup interval to a lower percentage at the end of the startup interval.

Numerous alternative embodiments are also possible.

BRIEF DESCRIPTION OF THE DRAWINGS

Other objects and advantages of the invention may become apparent upon reading the following detailed description and upon reference to the accompanying drawings.

Figure 1:
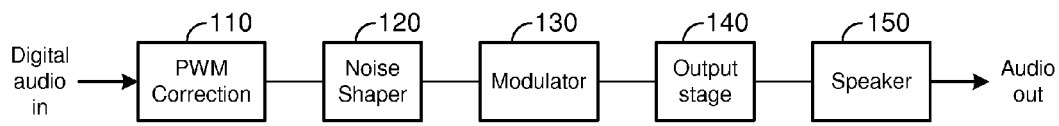
FIG. 1 is a diagram illustrating a typical PWM amplification system in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for minimizing startup transients in digital audio controllers that may result in audible artifacts in the output of an audio amplification system.

One embodiment of the invention comprises a digital PWM amplifier that includes a mechanism for controlling the amount of dead time in the audio output signal. When the amplifier starts up, the PWM signals provided to the output stage are simultaneously deasserted (i.e., there is dead time) for most of each switch period. The amount of dead time is gradually reduced over a series of switch periods until a nominal operating amount of dead time in each switch period is reached. Thus, the PWM signals are slowly ramped up from having a very large percentage of dead time (e.g., nearly 100%) to having a very small percentage of dead time (e.g., 1-2% to prevent shoot-through.)

In this embodiment, the dead time control mechanism is implemented in the PWM controller with the other PWM modulator functions. Typically, the PWM modulator includes a rise and fall calculation block and a modulator comparator block. The rise and fall calculation block generates output signals corresponding to the times at which the PWM signals should rise and fall. These signals are forwarded to the modulator comparator block, which compares a sawtooth wave to the signals and asserts (or deasserts) the output PWM signals based on the comparison.

The dead time control mechanism in this embodiment provides offset signals that are combined with (e.g., added to or subtracted from) the signals output by the rise and fall calculation block. The modified signals are then used by the modulator comparator block to generate output PWM signals which include the desired dead time. The offset signals initially have values that are sufficient to cause dead time for most of each switch period in the PWM output signals. The offset signals are gradually changed from their initial values to zero. As the offset signals are changed, the dead time is slowly ramped down from a maximum amount to a nominal operating amount which is normally present in the PWM output signals to prevent shoot-through in the output stage.

Before describing the exemplary embodiments of the invention in detail, it will be helpful to describe a conventional system. A typical PWM system is shown in FIG. 1. The PWM system consists of a PWM controller and an output stage which drives a load such as a speaker. Inside the PWM controller is a PWM correction block, a noise shaper block, and a modulator block. In normal operation, a digital audio signal is provided to the amplifier. The digital audio signal is typically in a 24-bit, pulse-code modulated (PCM) format and typically supplied at a 512 kHz sampling rate.

Referring to FIG. 1, the PWM nonlinearity correction block (110) applies a pre-correction to the digital audio signal that approximately corrects for the non-linear artifacts created by the PCM to PWM conversion. The pre-corrected digital audio is then noise-shaped in the noise shaper (120). The noise shaper typically quantizes the 24-bit PCM digital audio sample to a 10-bit PCM digital audio sample and uses noise shaping techniques to reduce the quantization noise inside the audio band, typically DC to 20 or 40 kHz. The modulator block (130) performs the PCM to PWM conversion on the 10-bit digital audio. 2-level (class D) modulation is typically used, but other PWM modulation schemes, like 3-level (class BD) modulation may also be used. The output stage (140) amplifies the PWM waveforms generated by the modulator block, typically utilizing high voltage power supplies, high power field-effect transistors (FETs), and various other components. The output stage produces an analog output which is typically filtered by a passive LC filter to attenuate the PWM switching signal and is provided to a load such as a speaker (150.)

Figure 2:
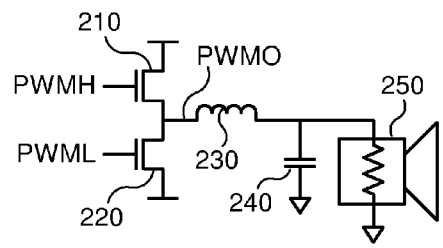
FIG. 2 is a diagram illustrating a typical 2-level output stage coupled to a load in accordance with the prior art.

A typical 2-level output stage coupled to a load is shown in FIG. 2. The output stage consists of two high power FET's, 210 and 220, which are coupled in series between a positive power rail and a negative power rail. The voltages on the power rails may vary from one application to another, and typically range from 24 to 50 volts on the high side and −24 to −50 volts on the low side. High-side FET 210 is controlled by a high-side PWM signal (PWMH) that is applied to its gate. Similarly, low-side FET 220 is controlled by a low-side PWM signal (PWML) that is applied to its gate. When one of the PWM signals is low, the corresponding FET is switched off, and when the signal is high, the corresponding FET is switched on.

The output of the output stage (PWMO) is taken at the node between FET's 210 and 220. When the duty cycle of the input PWM signals (PWMH and PWML) is 50%, the output is alternately pulled high and low for equal amounts of time, resulting in a 0 v output signal (disregarding DC offsets.) If the duty cycle of the high-side PWM signal (PWMH) is above 50% (and the duty cycle of low-side PWM signal PWMH is below 50%,) the output signal rises to some positive voltage. Conversely, if the duty cycle of PWMH is below 50% (and the duty cycle of PWMH is above 50%,) the output signal falls to some negative voltage. The output signal is coupled to speaker load 2150 through an LC low-pass filter consisting of inductor 230 and capacitor 240 to filter out the PWM switching noise.

Normally, the high-side and low-side FET's are not switched on at the same time, as this would allow a high current to flow from the positive power rail to the negative power rail. This rail-to-rail current is referred to as "shoot-through" current. It is usually desirable to have a small amount of dead time, during which both FET's are switched off, in order to prevent shoot-through. The dead time can be measured as the time between the falling edge of one PWM signal and the subsequent rising edge of the other PWM signal. The dead time is normally a very small fraction (e.g., 1%-2%) of each PWM switch period, and depends on the FET's and various design choices made by the engineer who designs the system.

Figure 3:
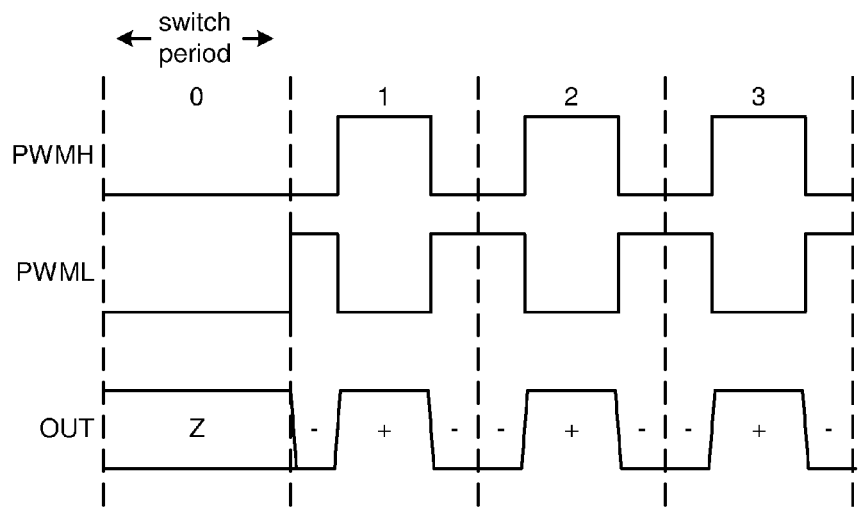
FIG. 3 is a diagram illustrating waveforms of the high-and low-side PWM signals and the output signal of a typical output stage in accordance with the prior art.

Referring to FIG. 3, a diagram illustrating waveforms of the high- and low-side PWM signals and the output signal of the output stage is shown. At the top of the figure is the high-side PWM signal, PWMH. In the middle of the figure is the low-side PWM signal, PWML. At the bottom of the figure is the signal produced by the output stage. Above the waveforms are numbers (0-3) indicating a series of successive PWM switch periods.

Before the system is started (i.e., at switch period 0,) neither PWMH nor PWML is asserted. Consequently, both FET's of the output stage are switched off, and the output of the output stage is not connected to either power rail. The output of the output stage is therefore tristated (represented by the "Z" in the figure.) In switch period 1, the system becomes active, with PWMH being asserted for approximately 50% of the period, and PWML being asserted for the remainder of the period (keeping in mind that there is a very small amount of dead time in which neither PWMH nor PWML is asserted.) In this system, the pulses of PWMH are centered in each switch period, while the pulses of PWML are centered on the divisions between switch periods. It can be seen that, at the beginning (and end) of each switch period, PWML is asserted and PWMH is deasserted, causing the output of the output stage to go to the voltage of the negative power rail. When PWMH is asserted (and PWML is deasserted,) the output of the output stage moves to the voltage of the positive power rail.

When the output stage begins operating, current may begin flowing through the load. As noted above, even if the PWM signals are being generated at a 50% duty cycle, the power rails may be unbalanced (e.g., +25 and −24) so that transient currents would be generated until equilibrium was established (e.g., capacitors charged, common mode voltage established, etc.) This would lead to audible artifacts of the transients as described above. If the system immediately starts driving the output stage at startup, the transient currents could be substantially higher.

As noted above, the present systems and methods minimize the audible effects of startup transients by controlling the amount of dead time in each PWM switch period for a short interval (e.g., several seconds) when an amplifier begins operation. The interval may, for example, be between 0.5 and 2 seconds. A simple method embodiment of the invention is illustrated by the flow diagram of FIG. 4. As shown in this figure, after the system is started (block 410,) the dead time is set to an initial, maximum value (block 420.) In the initial switch periods, the dead time will cover almost the entire switch period. This need not be 100% of the switch period, but it is preferred that the dead time should initially account for at least 95% of the switch period.

Then, over a series of switch periods, the dead time should be reduced (block 430) from the initial, maximum amount to a very small operating amount (block 440.) It is preferred that the dead time be gradually reduced, or ramped down, over the series of switch periods. For instance, the dead time may be decreased by 1% in each succeeding switch period. Alternatively, the dead time may be stepped down, so that it is maintained at a certain level for several switch periods, then decreased and maintained at the new level for several more switch periods, and so on. As indicated above, the dead time typically will not be eliminated entirely at the end of the start up interval, but will instead be reduced to a normal, non-zero operating level which is maintained to prevent shoot-through in the output stage.

The method may be implemented in many different types of systems. One exemplary system is a PWM amplifier having a structure essentially as shown in FIGS. 1 and 2. The amplifier is a class D system that uses a 2-level modulation scheme. As described above, high-side and low-side PWM signals are generated by the system's modulator to control the high-power FET's of the output stage. The dead time control mechanism in this embodiment is implemented in the modulator.

Figure 5:
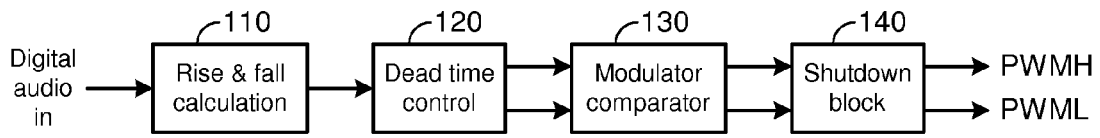
FIG. 5 is a functional block diagram illustrating the structure of a PWM modulator in accordance with one embodiment.

Referring to FIG. 5, a functional block diagram illustrating the structure of a PWM modulator as used in this embodiment is shown. The PWM modulator consists of a rise & fall calculation block 510, a dead time control block 520 a modulator comparator 530, and a shutdown block 540.

A noise shaper provides an audio value to rise and fall calculation block 510. Rise and fall calculation block 510 determines the appropriate timing in the PWM switch period for the rising and falling edges of each PWM pulse. The rise and fall calculation takes into account different modulation types and dead time correction for normal operation of the system. This calculation does not take into account the manipulation of dead time to minimize startup transients.

Rise and fall calculation block 510 provides signals corresponding to the computed rise and fall times to dead time control block 520. Dead time control block 520 is configured to calculate adjustments to the rise and fall times and to add these adjustments to the signals received from rise and fall calculation block 510. The adjustments shift the timing of the rising and falling edges of the PWM signals to produce the desired dead time. The adjustments generated by dead time control block 520 are gradually decreased over an initial series of switch periods, so that at the end of this interval, dead time control block 520 does not alter the signals received from rise and fall calculation block 510, but simply passes them through to modulator comparator 530.

Figure 6:
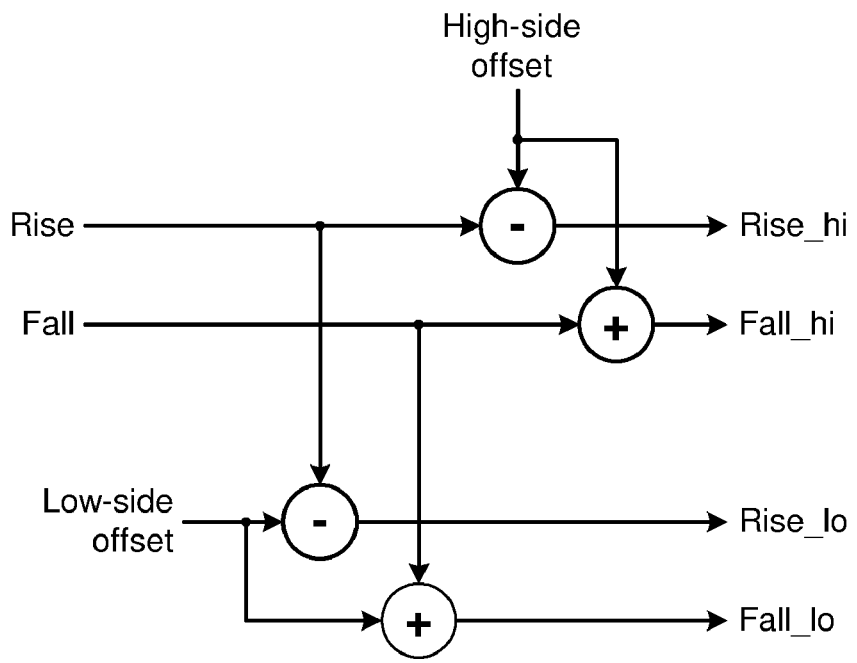
FIG. 6 is a functional block diagram showing the adjustment of the calculated rise and fall times to control the dead time in the PWM signals in accordance with one embodiment.

Dead time control block 520 may be implemented as illustrated in FIG. 6. This figure is a functional diagram showing the adjustment of the calculated rise and fall times to control the dead time in the PWM signals. The rise and fall calculation block 510 is assumed in this instance to provide separate rise and fall signals for each of the high-side and low-side PWM signals. Dead time control block 520 calculates high-side and low-side offsets based on the temporal position in the startup interval and the corresponding amount of desired dead time. The offsets are added to the rising edge signals and subtracted from the falling edge signals to reduce the amount of time that the high-side and low-side PWM signals will be asserted (high) during each PWM switch period. The calculated offsets are reduced through the startup interval to reduce the amount of dead time in the PWM signals.

Referring again to FIG. 5, dead time control block 520 provides the adjusted rise and fall signals to modulator comparator 530. Modulator comparator 530 compares the rise and fall values received from dead time control block 520 against a digital triangle wave to create the output PWM waveforms. Modulator comparator 530 generates both the PWM signal to control the high-side FET and the PWM signal to control the low-side FET. In this embodiment, the high-side and low-side PWM signals are passed through a shutdown system 540 before being provided to the output stage. Shutdown system 540 is configured to deassert both the high-side and low-side PWM signals if necessary in response to conditions such as high currents in the output stage.

Figure 4:
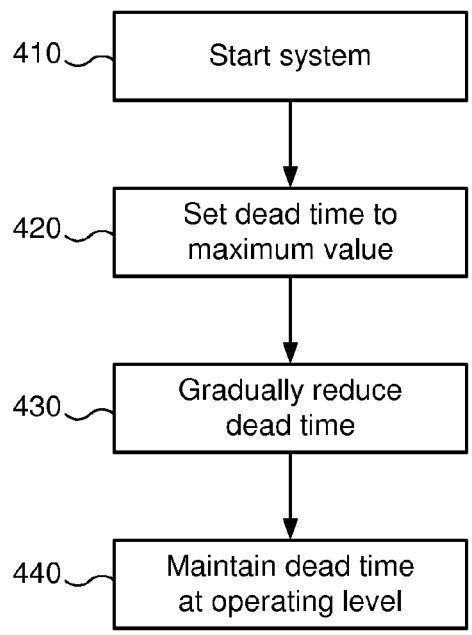
FIG. 4 is a flow diagram illustrating a simple method in accordance with one embodiment.
Figure 7:
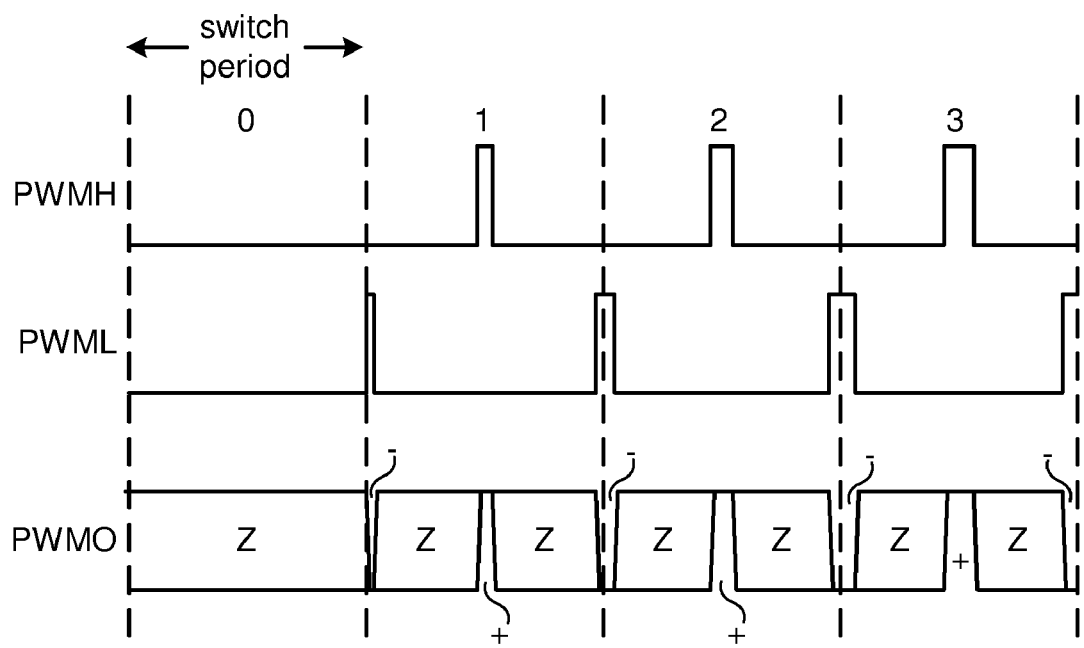
FIG. 7 is a diagram illustrating several waveforms associated with an embodiment as described in connection with FIGS. 4-6.

Referring to FIG. 7, a diagram illustrating several waveforms associated with an embodiment as described in connection with FIGS. 4-6 is shown. FIG. 7 depicts high-side and low-side PWM signals (PWMH, PWML) which are produced by a PWM controller, as well as a signal output by an output stage (PWMO) responsive to the PWM signals. FIG. 7 shows four PWM switch periods at the beginning of a startup interval.

In switch period 0 of FIG. 7, above the high-side PWM signal (PWMH) and the low-side PWM signal (PWML) are deasserted (low.) The entire switch period can be considered dead time. As a result, neither of the FET's of the output stage is switched on, and the output of the output stage is neither pulled high or pulled low. The output stage signal is therefore shown as being indeterminate (Z.)

When the system is started up, the PWM controller begins generating PWM signals which are provided to the output stage. Initially, the pulses of both PWMH and PWML are narrow, leaving dead time for a substantial portion of the switch period. As shown at the bottom of the figure, the signal produced by the output stage is negative for a very short time, followed by a substantial amount of dead time (Z,) then a short positive pulse, more dead time, and finally goes negative for a very short time. It can be seen that the amount of dead time in each successive PWM switch period gradually decreases, while the pulses of the signals become wider. These changes correspond to decreases in the offsets which are added to or subtracted from the rise and fall times by the dead time control block. By the end of the startup interval, the offsets have been reduced to 0, and the signals generated by the rise and fall calculation block are effectively passed directly through the dead time control block to the modulator comparator.

It should be noted that the changes in the dead time through PWM switch periods 1-3 is exaggerated in the figure in order to make them more apparent. In reality, the change in the amount of dead time may decrease only by a fraction of percent from one PWM switch period to the next, depending upon the length of the switch period and the length of the startup interval. In one embodiment, the startup interval is approximately two seconds, while the switch period is approximately 2.5 microseconds, so the change from nearly 100% dead time to a nominal operating dead time occurs over approximately 800,000 switch periods.

While the embodiment described above is implemented in a system having an output stage, an alternative embodiment may be implemented in a system having line-level PWM outputs. In this embodiment, a PWM output is generated conventionally, but the output is selectively enabled to produce decreasing amounts of dead time in each successive PWM switch period over a startup interval.

Figure 8:
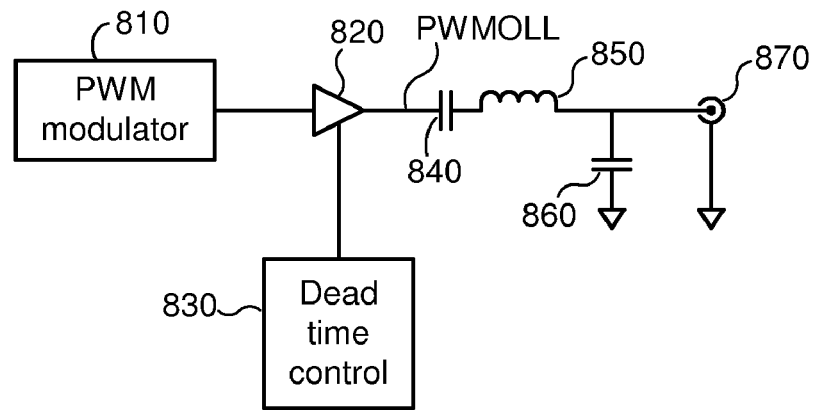
FIG. 8 is a portion of a PWM audio system in accordance with an alternative embodiment.

Referring to FIG. 8, a portion of a PWM audio system in accordance with this alternative embodiment is shown. This system includes a PWM modulator 810 that produces a PWM output signal. Other components of the system which precede PWM modulator 810 are not shown for purposes of clarity. The PWM signal generated by modulator 810 is provided to a buffer 820. Buffer 820 is selectively enabled by a signal received from dead time control unit 830. The output of buffer 820 (PWMOLL) is passively coupled to an LC filter through capacitor 840. The LC filter consists of inductor 850 and capacitor 860. The filtered signal is then provided at output jack 870.

This system uses a single PWM output signal instead of a pair of signals as used in conjunction with an output stage. Consequently, rather than shifting the rising and falling edges of the PWM signal, the output is enabled twice during each PWM switch period—once when the PWM signal is high, and once when the PWM signal is low. This produces an output signal which is very similar to that of the output stage described above, in which the signal has a repeating pattern in which it is low for a short time, followed by dead time, then high for a short time, followed by more dead time.

Figure 9:
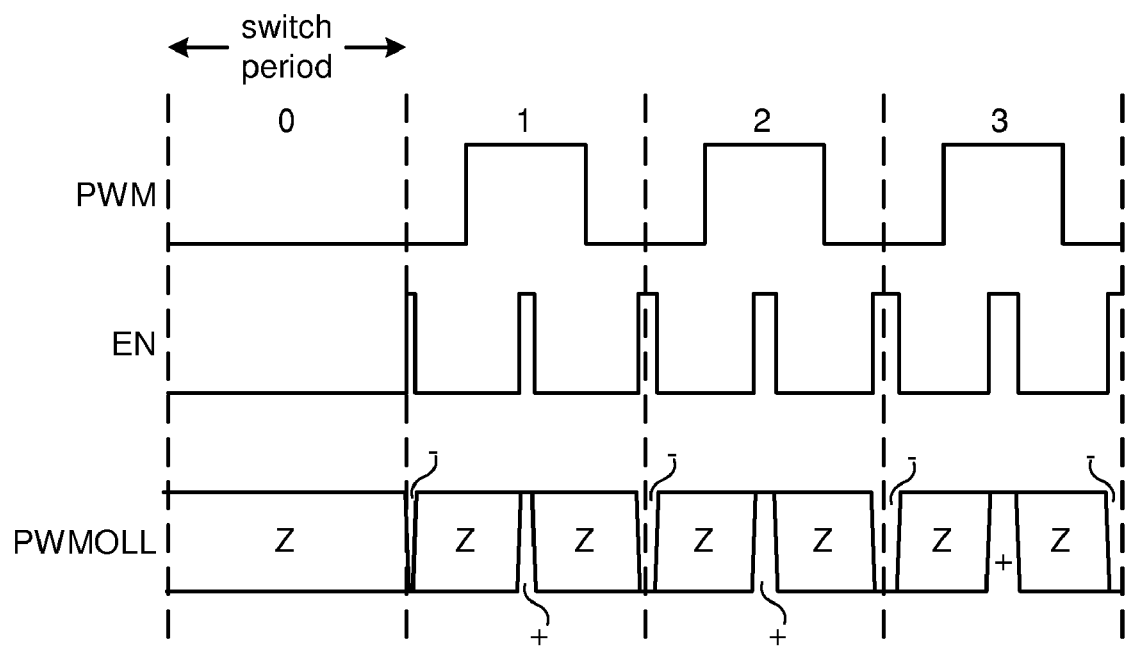
FIG. 9 is a diagram illustrating several waveforms associated with the alternative embodiment of FIG. 8.

Referring to FIG. 9, a diagram illustrating several waveforms associated with the alternative embodiment of FIG. 8 is shown. This figure includes a waveform corresponding to the PWM signal output by modulator 810 (PWM,) a waveform corresponding to the enable signal output by dead time control unit 830 (EN,) and a waveform corresponding to the line-level output of buffer 820 (PWMOLL.) It can be seen in this figure that the enable signal includes pulses which are centered on the high and low pulses of the PWM signal. The pulses of the enable signal have widths which gradually increased with each successive PWM switch period. As a result, the amount of dead time in each switch period (i.e., the time during which the enable signal is low) gradually decreases. As in FIG. 7, the changes in the waveforms are exaggerated to make them more apparent in the figure.

It should be noted that references above to gradual reduction of the dead time in each switch period is not intended to imply that the dead time is reduced in any particular manner. In some embodiments, the may be reduced by the same amount in each switch period. In other embodiments, the amount of the dead time may be decremented every nth switch period. In still other embodiments, the dead time may be reduced in a more irregular manner. All of these variations are intended to fall within the gradual reduction of the dead time as discussed above.

It should also be noted that, while the embodiments discussed above gradually decrease the dead time in the PWM signals from nearly 100% (i.e., over 99%) to a nominal operating amount, other embodiments could be configured to begin generating the PWM signals with less dead time (e.g., 90%, 75%, or even less) at the beginning of the startup interval. It is contemplated, however, that the higher percentages of dead time at the beginning of the startup interval will be more effective at reducing the audible effects of startup transients.

While the embodiments described above concern the elimination of audible artifacts of startup transients, it should be noted that alternative embodiments may use the same techniques to eliminate audible artifacts resulting from shutdown transients when the PWM output is switched off. In other words, the amount of dead time in the PWM signal can be ramped up from a nominal operating amount (e.g., 1%-2%) to a much higher amount (e.g., 99%) over a shutdown interval just before switching off the PWM output.

It should also be noted that references above to the "amount" of dead time in a PWM signal refer to the amount of dead time in a PWM switch period. Alternatively, references to the dead time may be phrased in terms of the percentage of the PWM switch period that is dead time.

The foregoing description is directed to exemplary embodiments having particular features which may or may not be included in other embodiments. It should be noted that alternative embodiments may incorporate other features, or may be implemented in other ways. For instance, if the present mechanism is implemented in a system with an output stage, the system may comprise a Class-BD system with a three-level output stage. In yet another embodiment, the dead time control mechanism may be implemented in the rise-fall calculation block instead of a subsequent block. In still another embodiment, a mechanism to selectively enable patent data signals could be implemented in a system having an output stage. Still other variations which will be apparent to those skilled in the art.

Those of skill in the art will understand that information and signals disclosed herein may be represented using any of a variety of different technologies and techniques. For example, data values, signals and other information that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with digital signal processors (DSPs) or other logic devices, application specific integrated circuits (ASICs), field programmable gate arrays (FPGAs), discrete gates or transistor logic, discrete hardware components, or any combination thereof designed to perform the functions described herein.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method for reducing audible artifacts of transients in PWM audio systems comprising:
   receiving an input audio signal;
   determining rise and fall times of the input audio signal;
   generating a PWM output signal based on the input audio signal; and
   controlling a percentage of dead time in the PWM output signal to change the dead time from a first percentage at the beginning of an interval of interest to a second percentage at the end of the interval of interest;
   wherein the controlling the percentage of dead time in the PWM output signal comprises calculating adjustments to the rise and fall times, and adjusting the rise and fall times based on the calculated adjustments.

2. The method of claim 1, wherein the interval of interest comprises a shutdown interval and the percentage of dead time in the PWM output signal is decreased from a higher first percentage to a lower second percentage.

3. The method of claim 1, wherein the interval of interest comprises a startup interval and the percentage of dead time in the PWM output signal is increased from a lower first percentage to a higher second percentage.

4. The method of claim 3, wherein controlling the percentage of dead time in the PWM output signal comprises gradually reducing the percentage of dead time over the startup interval.

5. The method of claim 4, wherein gradually reducing the percentage of dead time comprises decrementing the percentage of dead time in multiple PWM switch periods within the startup interval.

6. The method of claim 3, wherein:
   the calculated adjustments comprise calculated high-side offsets and low-side offsets; and
   controlling the percentage of dead time in the PWM output signal comprises adding the calculated high-side offsets to the rise times, and subtracting the calculated low-side offsets from the fall times, wherein the calculated high-side and low-side offsets are reduced over the startup interval.

7. The method of claim 3, wherein controlling the percentage of dead time in the PWM output signal comprises generating a first PWM signal and selectively enabling the first PWM signal to produce the PWM output signal.

8. The method of claim 3, further comprising providing the PWM output signal to an output stage and generating an analog audio output signal based on the PWM output signal.

9. The method of claim 3, further comprising providing the PWM output signal as a line-level output signal.

10. The method of claim 3, wherein the initial percentage is at least 99%, the lower percentage is a nominal operating percentage, and the startup interval is between 0.5 and 2 seconds.

11. An audio system configured to reduce audible artifacts of transients in PWM audio systems, the system comprising:
   a PWM controller configured to
      receive an input audio signal,
      determine rise and fall times of the input audio signal,
      generate a PWM output signal based on the input audio signal,
      calculate adjustments to the rise and fall times, and
      adjust the rise and fall times, based on the calculated adjustments, to thereby control a percentage of dead time in the PWM output signal to change the dead time from a first percentage at the beginning of an interval of interest to a second percentage at the end of the interval of interest.

12. The system of claim 11, wherein the interval of interest comprises a shutdown interval and the percentage of dead time in the PWM output signal is decreased from a higher first percentage to a lower second percentage.

13. The system of claim 11, wherein the interval of interest comprises a startup interval and the percentage of dead time in the PWM output signal is increased from a lower first percentage to a higher second percentage.

14. The system of claim 13, wherein the PWM controller is configured to gradually reduce the percentage of dead time over the startup interval.

15. The system of claim 14, wherein the PWM controller is configured to decrement the percentage of dead time in multiple PWM switch periods within the startup interval.

16. The system of claim 13, wherein:
the calculated adjustments comprise calculated high-side offsets and low-side offsets; and
the PWM controller is configured to add the calculated high-side offsets to the rise times, and subtract the calculated low-side offsets from the fall times, wherein the calculated high-side and low-side offsets are reduced over the startup interval.

17. The system of claim 13, further comprising an output stage, wherein the PWM controller is configured to provide the PWM output signal to the output stage and wherein the output stage is configured to generate an analog audio output signal based on the PWM output signal.

18. The system of claim 13, further comprising a line-level output jack, wherein the PWM controller is configured to provide the PWM output signal as an output on the line-level output jack.

19. The system of claim 13, wherein the PWM controller is configured to set the initial percentage of dead time to at least 99%, to reduce the percentage of dead time to a nominal operating percentage, and to reduce the percentage of dead time from the first percentage to the second percentage in an interval of between 0.5 and 2 seconds.

20. An audio system configured to reduce audible artifacts of transients in PWM audio systems, the system comprising:
a PWM modulator configured to
receive an input audio signal, and
generate a PWM signal based on the input audio signal;
a buffer configured to
receive the PWM signal generated by the PWM modulator, and
produce a PWM output signal based on the PWM signal received from the PWM modulator; and
a controller configured to selectively enable the buffer to control a percentage of dead time of the PWM output signal to change the dead time from a first percentage at the beginning of an interval of interest to a second percentage at the end of the interval of interest.

* * * * *